(12) United States Patent
Lee et al.

(10) Patent No.: US 9,986,072 B2
(45) Date of Patent: May 29, 2018

(54) MOBILE TERMINAL

(71) Applicant: LG ELECTRONICS INC., Seoul (KR)

(72) Inventors: Joseph Lee, Seoul (KR); Donghyun Kim, Seoul (KR); Kyungui Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

(21) Appl. No.: 15/545,599

(22) PCT Filed: Mar. 23, 2015

(86) PCT No.: PCT/KR2015/002807
§ 371 (c)(1),
(2) Date: Jul. 21, 2017

(87) PCT Pub. No.: WO2016/125947
PCT Pub. Date: Aug. 11, 2016

(65) Prior Publication Data
US 2018/0007181 A1    Jan. 4, 2018

(30) Foreign Application Priority Data

Feb. 6, 2015  (KR) .................. 10-2015-0018606

(51) Int. Cl.
*H04M 1/02*   (2006.01)
*H05K 7/20*   (2006.01)

(52) U.S. Cl.
CPC ...... *H04M 1/0202* (2013.01); *H05K 7/20472* (2013.01)

(58) Field of Classification Search
CPC ...... H04M 1/236; H04M 1/0249; H04M 1/18; H04M 1/0202; G06F 1/1698; G06F 1/203;

(Continued)

(56) References Cited

U.S. PATENT DOCUMENTS 8,982,580 B2 * 3/2015 Iwai .................... H04M 1/0202
                                                       29/428
9,819,383 B2 * 11/2017 Youn .................... H04B 1/3888
(Continued)

FOREIGN PATENT DOCUMENTS

JP    2002-100713    4/2002
JP    2010-212543    9/2010
(Continued)

OTHER PUBLICATIONS

International Search Report and Written Opinion dated Oct. 29, 2015 issued in PCT/KR2015/002807 (with English Translation).

*Primary Examiner* — Thanh Le
(74) *Attorney, Agent, or Firm* — KED & Associates, LLP

(57) ABSTRACT

There is disclosed a mobile terminal including a case comprising an electric control unit in which electronic components are loaded; a display unit coupled to a front surface of the case; a frame coupled to the case and supporting a rear surface of the display unit, the frame comprising a metallic material; a mainboard loaded in the case; a drive chip loaded in the mainboard; a shield can covering components loaded in the mainboard, the shied comprising a hole formed, corresponding to the drive chip; a thermal conductivity sheet comprising one surface in contact with a top surface of the drive chip and the other surface in contact with an inner surface of the frame; and a flexible material insertedly filling in a space formed between the thermal conductivity sheet and the frame, so that the heat generated in the drive chip of the mobile terminal may be effectively emitted and that only the portion of the mobile terminal, where the drive chip is loaded, may be prevented from being heated when the user is using the mobile terminal and the other components may be prevented from being damaged by the heat.

12 Claims, 8 Drawing Sheets

(58) Field of Classification Search
CPC ....... G06F 1/1656; G06F 1/1626; H01Q 1/44; H01Q 1/243; H04B 1/3888; H04B 2001/3894; H04K 7/20472
See application file for complete search history.

(56) References Cited

U.S. PATENT DOCUMENTS

| | | | |
|---|---|---|---|
| 9,866,969 B2* | 1/2018 | Nakamura | H04M 1/0202 |
| 2016/0173673 A1* | 6/2016 | Hyun | H04M 1/236 |
| | | | 455/566 |

FOREIGN PATENT DOCUMENTS

| | | |
|---|---|---|
| KR | 10-2008-0082744 | 9/2008 |
| KR | 10-2015-0009024 | 1/2015 |
| WO | WO 2004/047510 | 6/2004 |

* cited by examiner

MOBILE TERMINAL

CROSS-REFERENCE TO RELATED PATENT APPLICATIONS

This application is a U.S. National Stage Application under 35 U.S.C. § 371 of PCT Application No. PCT/KR2015/002807, filed Mar. 23, 2015, which claims priority to Korean Patent Application No. 10-2015-0018606, filed Feb. 6, 2015, whose entire disclosures are hereby incorporated by reference.

FIELD

Embodiments of the present invention relate to a mobile terminal which may improve radiation performance by transferring the heat emitted from a drive chip to a frame.

BACKGROUND

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

As the functions of mobile terminals become more diversified, heat is generated from a drive chip configured to drive a mobile terminal and much heat is generated in an application processor which is a main drive chip for driving the mobile terminal. If much heat is generated in such a drive chip, the performance of the drive chip might be deteriorated disadvantageously. It emerged as an important issue to sink the heat generated in the drive chip so as to secure the performance of the drive chip.

DETAILED DESCRIPTION OF THE INVENTION

Technical Problem

To overcome the disadvantages, an object of the present invention is to provide a mobile terminal which may improve radiation efficiency for the heat generated in a heated drive chip and which may provide a heat-sink structure configured to prevent a shock applied to the mobile terminal to the drive chip.

Technical Solution

To achieve these objects and other advantages and in accordance with the purpose of the embodiments, as embodied and broadly described herein, a mobile terminal includes a case comprising an electric control unit in which electronic components are loaded; a display unit coupled to a front surface of the case; a frame coupled to the case and supporting a rear surface of the display unit, the frame comprising a metallic material; a mainboard loaded in the case; a drive chip loaded in the mainboard; a shield can covering components loaded in the mainboard, the shied comprising a hole formed, corresponding to the drive chip; a thermal conductivity sheet comprising one surface in contact with a top surface of the drive chip and the other surface in contact with an inner surface of the frame; and a flexible material insertedly filling in a space formed between the thermal conductivity sheet and the frame.

The thermal conductivity sheet may be a conductive tape which is a larger than the hole of the shield can, comprising an adhesive element, and one surface of a first area may be adhered to the top surface of the drive chip, and the other surface of the first area may be adhered to a lower surface of the flexible material, and the other surface of the second area may be in contact with the inner surface of the frame.

The thermal conductivity sheet may include a graphite fabric; a PET sheet disposed on one surface of the graphite fabric; and an adhesion layer disposed on the other surface of the graphite fabric.

The thermal conductivity sheet may further include an adhesive tape disposed on the inner surface of the metal frame to be adhered to a top surface of the flexible material and a second area of the adhesion layer.

The adhesion layer and the adhesive tape may further include a thermal conductivity material.

The thermal conductivity sheet may include a first thin sheet disposed on one surface of the flexible material; and a second thin sheet disposed on the other surface of the flexible material, and the portions of the first and second thin sheets which are projected around the flexible material may be adhered to each other to form an adhered portion.

The adhered portion may be formed by a thermal-compression-bonding method.

The mobile terminal may further include a base sheet covering a surface of the flexible material, wherein the thermal conductivity sheet may be plated on a surface of the base sheet.

The mobile terminal may further include a thermal conductivity sheet provided one or more of between the thermal conductivity sheet and the drive chip and between the thermal conductivity sheet and the frame.

The thermal conductivity sheet may be TIM (Thermal Interface Material) or PCM (Phase Change Material).

Advantageous Effects

According to at least one of the embodiments of the present disclosure, the heat generated in the drive chip of the mobile terminal may be emitted effectively and the portion where the drive chip is provided may be prevented from being heated so that damage to the other components caused by the heat may be prevented. In addition, the shock applied to the frame may not be transferred to the drive chip but absorbed, using a flexible material with a high compressibility.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF SPECIFIC EMBODIMENTS

Figure 1:
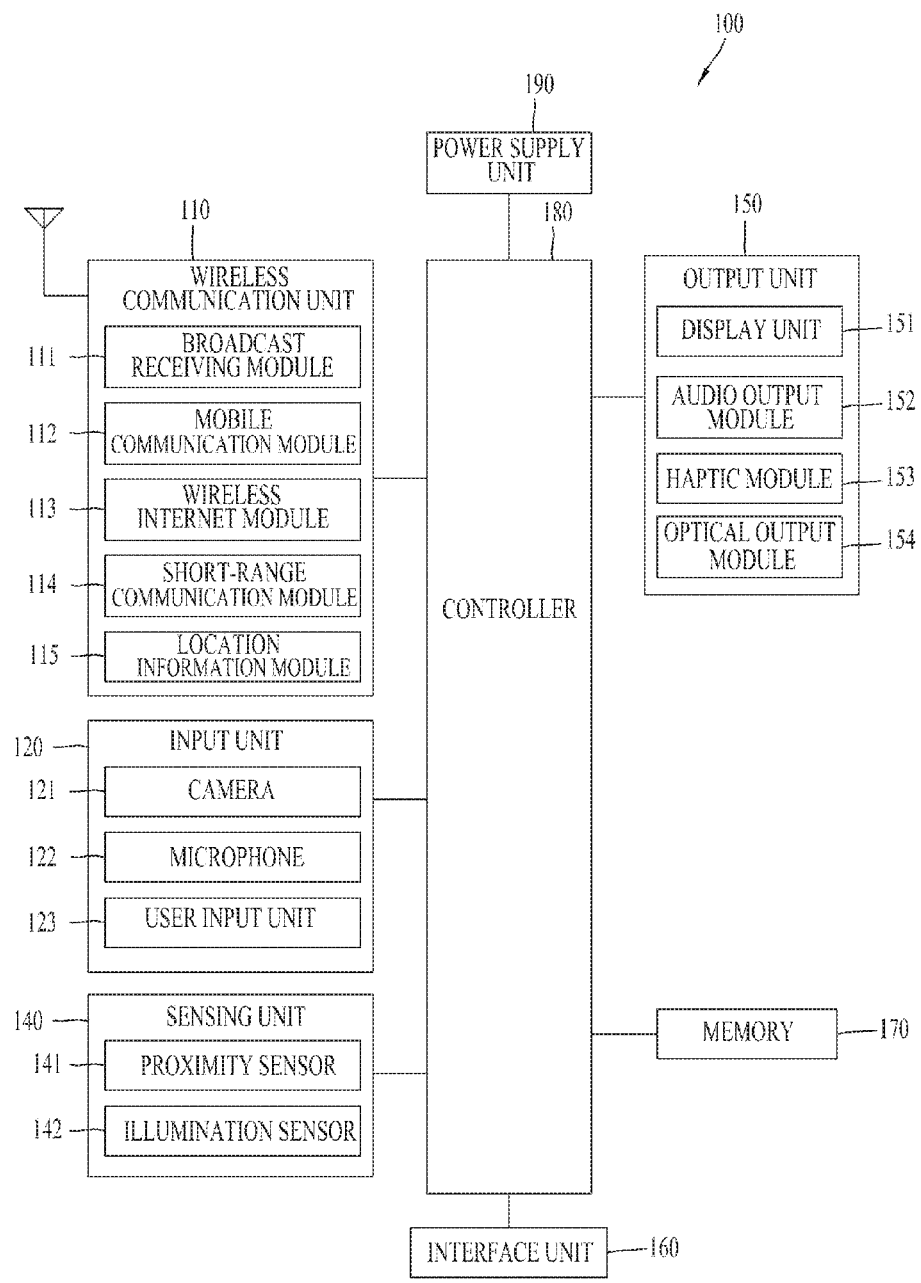
FIG. 1 is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 2:
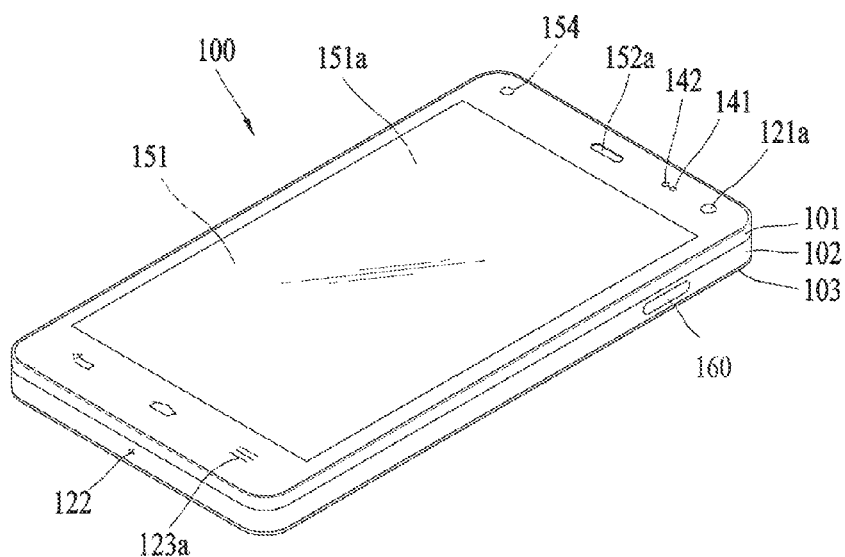
FIGS. 2 and 3 are conceptual views of one example of the mobile terminal, viewed from different directions.
Figure 3:
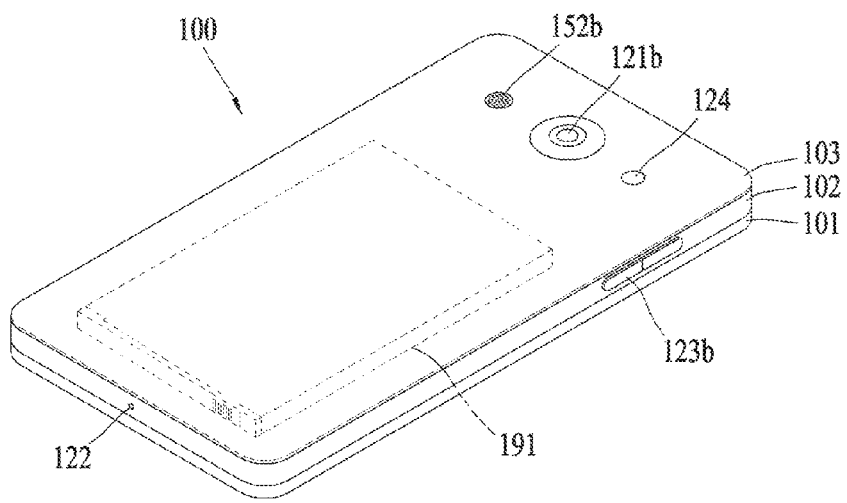

FIG. 1 is a block diagram of a mobile terminal in accordance with the present disclosure, and FIGS. 2 and 3 are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented. Referring now to FIG. 1, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring now to FIGS. 2 and 3, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

In this instance, the terminal body shall be understood as a concept regarding the mobile terminal 100 as one or more assemblies.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may further include a display unit 151, first and second audio output units 152a and 152b, a proximity sensor 141, an illuminance sensor 142, an optical output unit 154, first and second cameras 121a and 121b, first and second manipulation units 123a and 123b, a microphone 122 and an interface unit 160.

Hereinafter, referring to FIGS. 2 and 3, the mobile terminal 100 will be described as one example of the present disclosure, having the display unit 151, the first audio output unit 152a the proximity sensor 141, the illuminance sensor 142, the optical output unit 154, the first camera 121a and the first manipulation unit 123a arranged in a front surface of the terminal body; the second manipulation unit 123b, the microphone 122 and the interface unit 160 arranged in a lateral surface of the terminal body; and the second audio output unit 152b and the second camera 121b arranged in a rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 displays (i.e., outputs) the information processed in the mobile terminal 100. For example, the display unit 151 may display information on an execution screen of an application driven in the mobile terminal 100 or UI (User Interface) and GUI (Graphic User Interface) information based on such execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 2 illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

Figure 4:
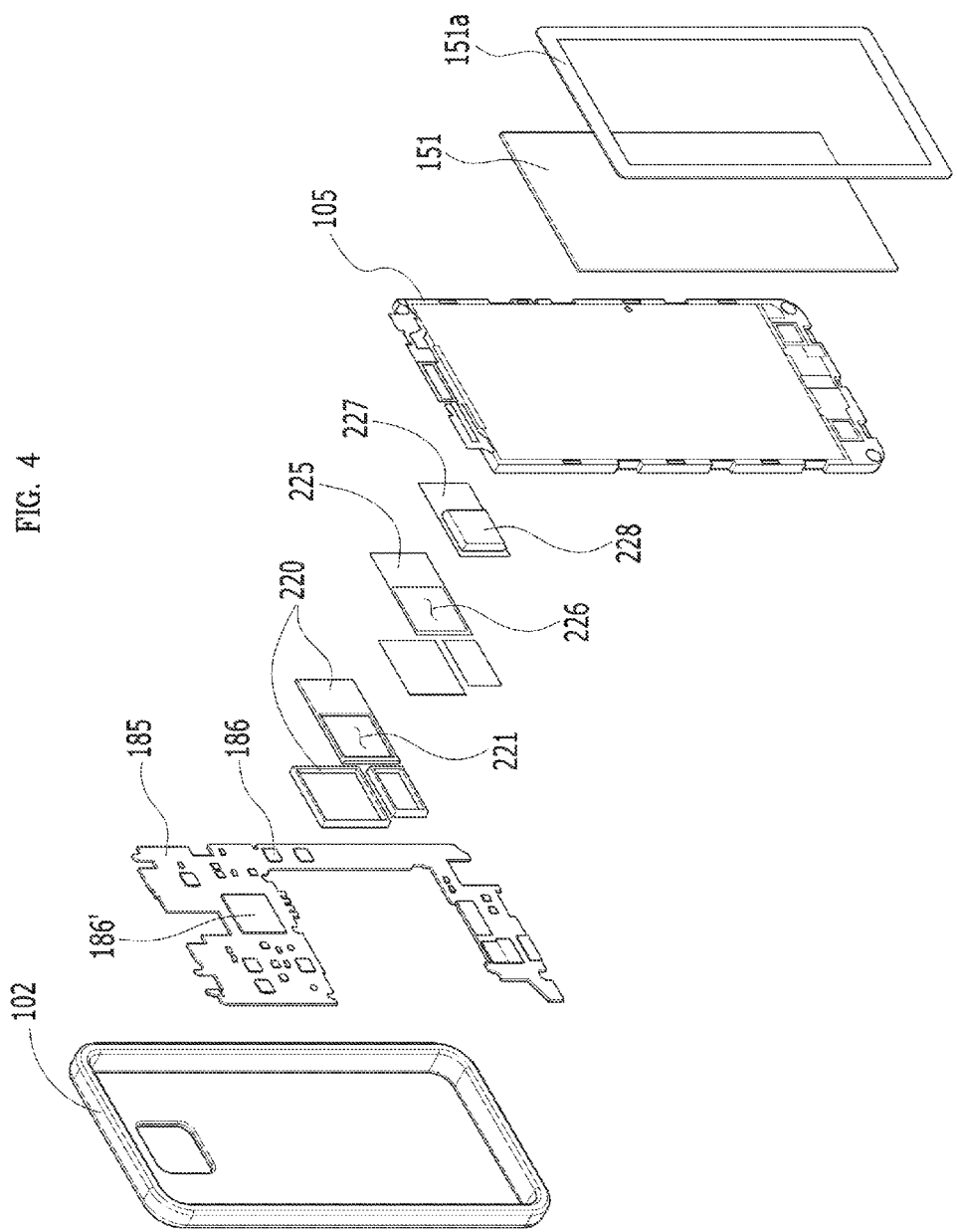
FIG. 4 is an exploded perspective diagram illustrating one example of the mobile terminal in accordance with the present disclosure.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen FIG. 4 is an exploded perspective diagram illustrating one example of the mobile terminal in accordance with the present disclosure. In FIG. 4 are shown a window 151a, a display unit 151, a frame 105, a mainboard 185, a drive chip 186, a shield can 220, a battery 191 and a rear case 102.

The display unit 151 may be provided in a front surface of the mobile terminal 100. In recent, a touch sensor is disposed on the display unit 151 and the display unit 151 implements an input function as well as an output function, so that it may trend to be enlarged.

The window 151a may protect the display unit 151, in front of the display unit 151. The touch sensor is disposed on the window 151a and the window 151a having the touch sensor may be disposed on the display unit 151. In this instance, the display unit 151 having a touch input function may be provided.

Electronic components may be loaded in the mainboard 185 to realize the diverse functions of the mobile terminal. Such electronic components are configured to control the operation of the display unit 151, process external inputs from the touch sensor, the user input unit 123 and other various sensors and control the functions of the components provided in the mobile terminal, for example, the camera 121, the speaker 152b, the receiver 152b and the like.

Various drive chips 186 are loaded for the diverse functions, respectively. Especially, an application processor (AP) is a non-memory semiconductor used not only in a mobile terminal but also in a digital TV and it is employed as a CPU (Central Processor Unit) of a conventional computer. The application processor is the most technology-intensive part of the drive chips 186 loaded in the mobile terminal. The application processor is a system-on-chip integrated with the OS necessary to drive the mobile terminal and the function of driving applications and controlling various system devices and interfaces.

A recently released mobile terminal requires a high performance application processor to perform large scale operations, for example, game playing, web browsing, video file viewing, music listening and the like. When it is driven, the application processor generates much heat and it is then very important to sink the heat of the application processor so as to keep the performance of the application processor.

The shield can 220 may be used in protecting the drive chip 186 loaded in the surface of the mainboard 185 and it may be disposed on the mainboard 185 to load other components. The shield can 220 is formed of a metallic material, with a cover shape configured of a roof covering top surfaces of drive chips 186 and a wall disposed between the roof and the mainboard 185.

The shield can 220 is spaced apart a predetermined distance from the drive chip 186 to prevent a shock from being transferred to the drive chip 186 directly. Some drive chip 186 such as the application processor is relatively thicker than the other drive chips 186. When the shield can 220 is fabricated to be fitted to the thickness of the thick drive chip 186', the height of the shield can 220 is increased and the mobile terminal is thicker.

A hole 221 is formed in the shield can 220, corresponding to the drive chip 186' which is thicker than the other chips, so that the mobile terminal 100 may be prevented from getting thicker.

The display unit 151 may be generally disposed in the frame 105. As shown in FIG. 2, the front case 101 may cover the front surface of the display unit 151. To reduce the bezel as shown in FIG. 4, the front case 101 may be omitted and the display unit 151 may be disposed in the frame 105, while the window 151a provided in the front surface may cover the front surface of the display unit 151.

The camera 121, the receiver or the like which were loaded in the front case 101 of the conventional mobile terminal may be loaded in a space formed between the frame 105 and the rear case 102. The frame 105 may include a metallic material such as magnesium. In this instance, the light frame having a sufficient rigidity may be provided.

The frame 105 has a flat front surface and a rear surface having unevenness formed to seat the components stably as shown in FIG. 4.

In addition, the frame 105 includes a metallic material and the frame 105 may contact with electronic components such as an antenna so that it may be employed as a ground. The frame 105 may be grounded with the electronic components by direct contact or via the mainboard 185. To ground the frame 105 with the electronic components, a conductive material has to be connected there between. The shield can 220 disposed in the mainboard 185 may contact with the frame 105 and the components such as the antenna loaded in the mainboard 185 may be then grounded with the frame via the shield can 220.

To maintain the contact with the shield can 220, a conductive gasket 225 may be disposed between the frame 105 and the shield can 220. The conductive gasket 225 may include a conductive material capable of transferring electricity as a thin material with adhesion. The conductive gasket 225 may physically and electrically couple the shield can 220 with the frame 105. A hole 226 may be formed even in the conductive gasket 225, corresponding to the hole 221 formed in the shield can 220.

The frame 105 includes a metallic material and it has a high thermal conductivity and a large area, so that it can diffuse heat efficiently. The heat may be transferred to the frame by direct contact with the shield can and the heat can be diffused via the shield can 220 formed of the metallic material in contact with the frame 105.

The rear case 102 is coupled to a rear surface of the frame 105. An electric control unit is formed between the frame 105 and the rear case 102. In the electric control unit may be loaded the camera 121, the receiver 152, the microphone 122 and other parts as well as the battery 191, the mainboard 185.

The shield can 220 is employed to protect and ground the drive chip 186 loaded in the surface of the mainboard 185 and to transfer and diffuse the heat generated in the drive chip 186 to the frame simultaneously.

When the shield can 220 disposed in the position corresponding to the thick drive chip 186' is omitted to reduce the thickness of the mobile terminal 100, the mobile terminal 100 could be partially heated by the heat generated in the thick drive chip 186'. Especially, the drive chip 186' such as the application processor is relatively large and generates much heat. Accordingly, it is necessary to diffuse the heat through the frame 105.

The object of the present disclosure is to provide a heat sink structure provided between the frame 105 and the application processor 186' to diffuse the heat generated in the application processor 186' and to prevent a shock applied to the frame 105 from being transferred simultaneously.

A thermal pad used for conventional heat sink has a low compressibility. When such a thermal pad is used for a fixed material such as PC or a shock-resistant material, there is no problem. However, the thermal pad has a low elasticity and it has a problem to be used by direct contact with a material easily breakable by a shock.

A heat radiation material provided between the frame 105 and the heated drive chip 186' has to have a large contact area for thermal conductivity. A porous structure such as sponge or loofah sponge to enhance the compressibility related to the elasticity. In other words, thermal conductivity and elasticity conflict with each other. To enhance the function of one of them, the function of the other has to be sacrificed disadvantageously.

To solve the disadvantage, the present disclosure provides a heat sink material which may satisfy the conflicted characteristics, using a thermal conductivity sheet 227 and a flexible material 228. A predetermined portion of the thermal conductivity sheet 227 is in contact with the heated drive chip 186' and another predetermined portion is in contact with the frame 105, so that the heat of the heated drive chip 186' can be transferred to the frame 105 via the thermal conductivity sheet 227. At the same time, a flexible material 228 such as sponge having a high elasticity is used so as to absorb the shock transferred via the frame 105.

Figure 5:
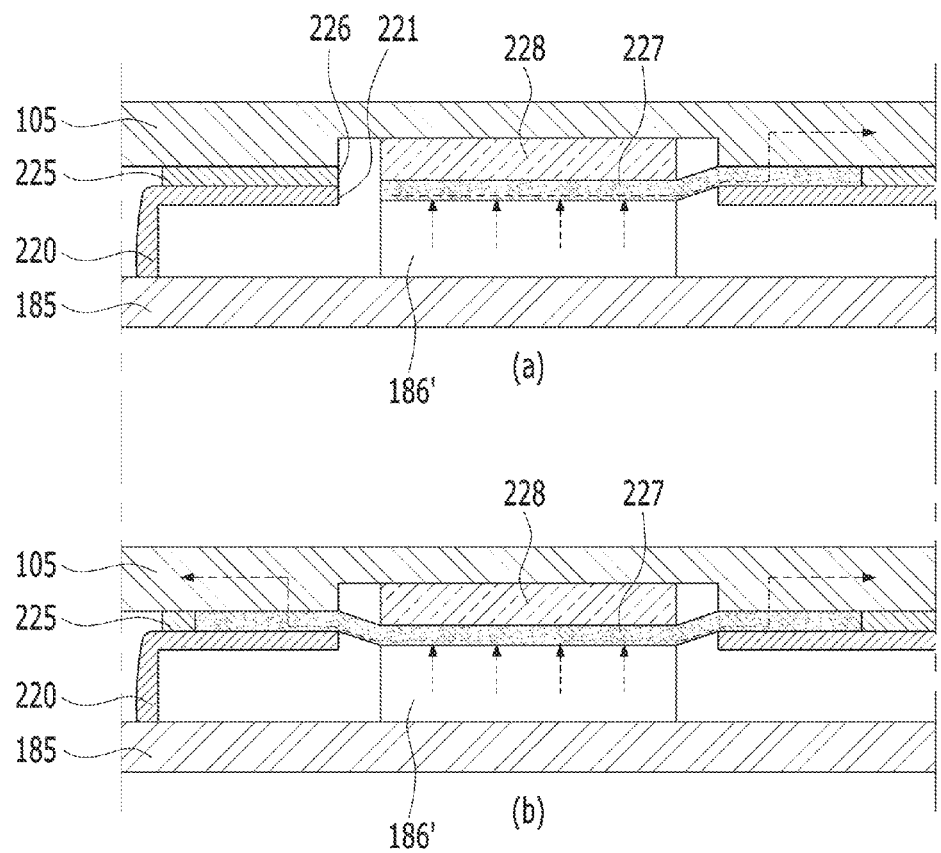
FIG. 5 is a sectional diagram illustrating one example of a drive-chip heat sink structure of the mobile terminal in accordance with the present disclosure.

FIG. 5 is a sectional diagram illustrating one example of a drive-chip heat sink structure of the mobile terminal in accordance with the present disclosure. In this embodiment, a heat sink structure is formed by using a sponge material corresponding to the heated drive chip 186' and a conductive tape 227 larger than the hole formed in the shield can 220. The conductive tape 227 includes a material having a high thermal conductivity and an adhesive material. Also, the conductive tape 227 has both adhesion and thermal conductivity.

One surface of the conductive tape 227 covers the heated drive chip 186' exposed via the hole of the shield can 220 after the shield can 220 is loaded on the mainboard. The conductive tape 227 is larger than the hole and the area of the conductive tape 227 may be divided into a first area covering the heated drive chip 186' and a second area located in the top surface of the shield can 220.

The flexible material 228 having a high compressibility such as sponge is disposed in a lateral surface opposite to the surface in contact with the heated drive chip 186' in the first area. The conductive gasket 225 covering the other portion of the shield can 220, except the portion covered by the conductive tape 227, is covered and the frame 105 is seated, so that the mainboard and the frame 105 can be grounded with each other.

When the frame 105 is coupled to the heat sink structure, the second area of the conductive tape 227 contacts with the frame 105 and the heat absorbed from the heated drive chip 186' by the first area may be diffused to the frame 105 via the second area of the conductive tape 227. As shown in FIG. 5 (*a*), one side of the conductive tape may contact with the frame 105. As shown in FIG. 5 (*b*), both sides of the conductive tape may contact with the frame 105 and the heat may be diffused in both directions.

A groove 105 may be formed in the frame 105, corresponding to the heated drive chip 186', to secure a predetermined space where the flexible material 228 is disposed by securing a space between the frame 105 and the heated drive chip 186'.

Figure 6:
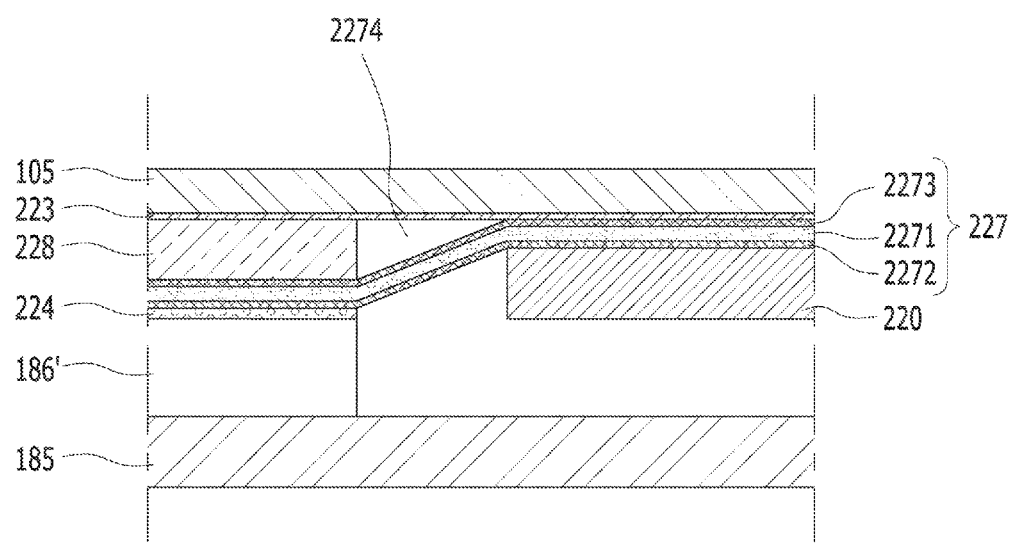
FIG. 6 is a sectional diagram illustrating another example of the drive-chip heat sink structure of the mobile terminal in accordance with the present disclosure.

FIG. 6 illustrates a modified example of the FIG. 5. The conductive tape is formed of three sequentially disposed layers. A graphite fabric 2271 having a high thermal conductivity is provided as a main part. An adhesion layer 2273 is disposed on a surface of the graphite fabric 2271, which is toward the frame 105 and the flexible material 228, to adhere the frame 105 and the flexible material 228 to each other. PET (Polyethylene Terephthalate) sheet 2272 is disposed on a surface of the graphite fabric 2271, which is toward the heated drive chip 186' and the shield can 220.

At this time, there is a space 2274 exposed between the portion of the adhesion layer 2273 contacting with the flexible material 228 and the portion contacting with the frame 105. The space 2274 may act as an air gap formed by the thickness and elasticity of the flexible material 228, so that foreign substances could be attached to the space 2274 disadvantageously.

To solve the disadvantage, an adhesive tape 223 attached to an inner surface of the frame may be further provided. The adhesive tape 223 may be extended from between the frame 105 and the flexible material 228 to between the frame 105 and the adhesion layer 2273. Accordingly, the adhesive tape 223 may cover the air gap 2274 exposed from the adhesion layer 2273.

The adhesion layer 2273 and the adhesive tape 223 have a low thermal conductivity. When using the thermal conductive tape including a thermal conductive material, thermal conductivity efficiency may be enhanced. Meanwhile, to supplement a high thermal resistance of the PET sheet 2272, a thermal conductive material, for example, TIM (Thermal Interface Material) and PCM (Phase Change Material) may be disposed between the PET sheet 2272 and the heated drive chip 186' and the thermal conductivity efficiency may be then enhanced.

Figure 7:
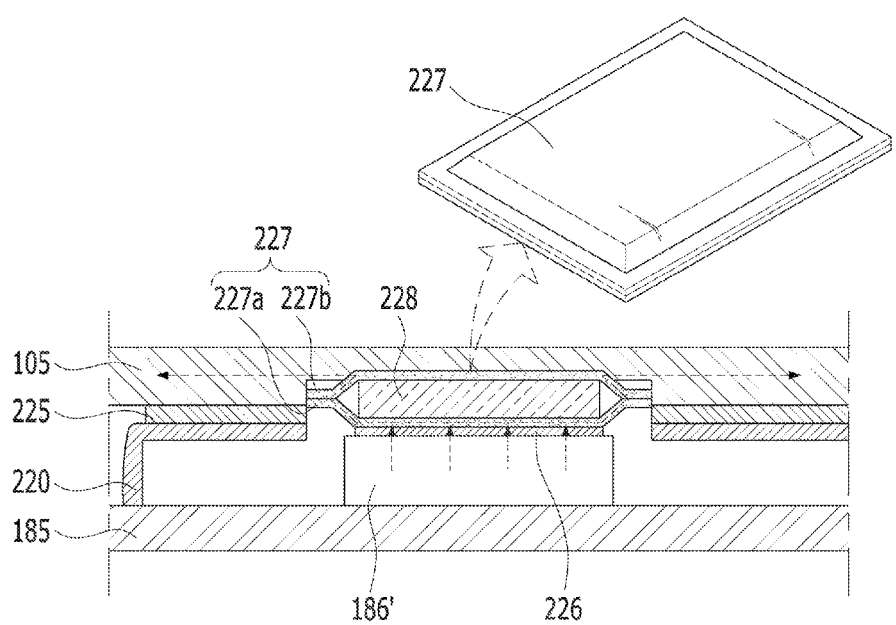
FIG. 7 is a sectional diagram illustrating a further example of the drive-chip heat sink structure of the mobile terminal in accordance with the present disclosure.

FIG. 7 is a sectional diagram illustrating a further example of the drive-chip heat sink structure of the mobile terminal in accordance with the present disclosure. Referring to FIG. 7, the flexible material 228 is disposed between two thermal conductive sheets. The thermal conductive sheet 227 is larger than the flexible material 228 so that the extra portions of the thermal conductivity sheets 227 are pressed and adhered to each other. In other words, the thermal conductivity sheets are cushion or sitting cushion shaped. Two sheets are connected to each other and the heat generated in the heated drive chip 186' is moved and transferred along the thermal conductivity sheets 227 to the frame 105.

When using one thermal conductivity sheet 227 surrounding the flexible material 228, the elasticity of the thermal conductivity sheet 227 is relatively weak and the length of the lateral surface connecting one surface and the other surface of the flexible material 228 to each other is not changeable. Accordingly, the shock applied to the frame 105 can be transferred as it is.

To solve such a disadvantage, the present disclosure may provide the two thermal conductivity sheets 227*a* and 227*b* of which cross sections are adhered to each other. In this instance, an angle of the portion where the two thermal conductivity sheets are adhered to each other may be changed to change the height of the flexible material 228.

Especially, the adhered portion of the two plate-shaped sheets is wide enough to have high heat transfer efficiency. A plurality of flexible materials 228 may be disposed on a plurality of conductive plate-shaped sheets and then the sheets are thermal-compression-bonded. Accordingly, mass production is facilitated.

Figure 8:
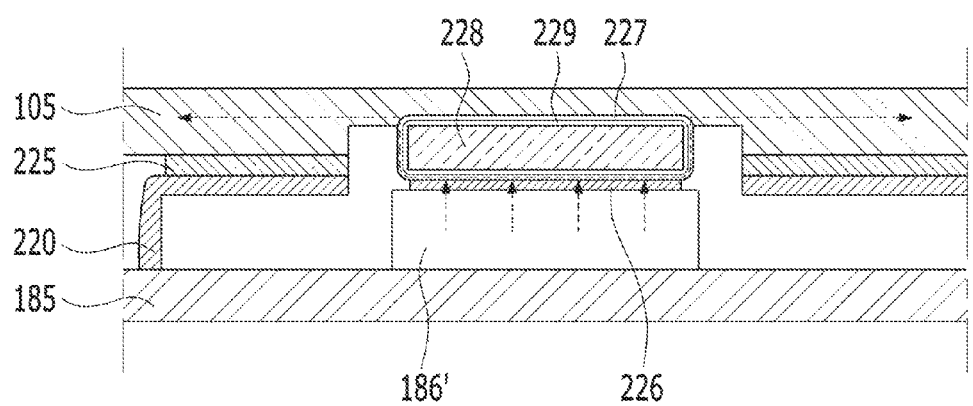
FIG. 8 is a sectional diagram illustrating a still further example of the drive-chip heat sink structure of the mobile terminal in accordance with the present disclosure.
Figure 9:
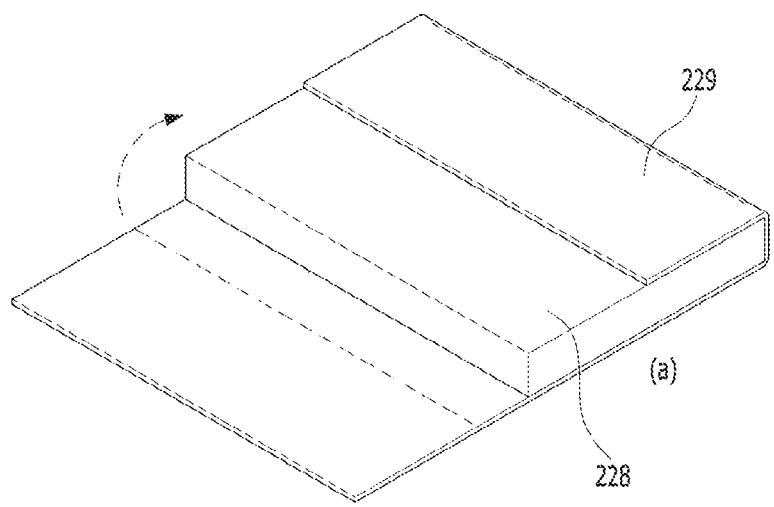
FIG. 9 is a diagram illustrating a method of fabricating the heat sink structure shown in FIG. 8.
Figure 9:
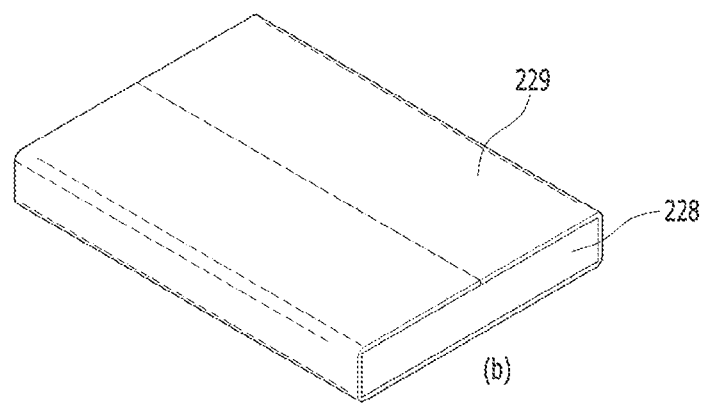
Figure 9:
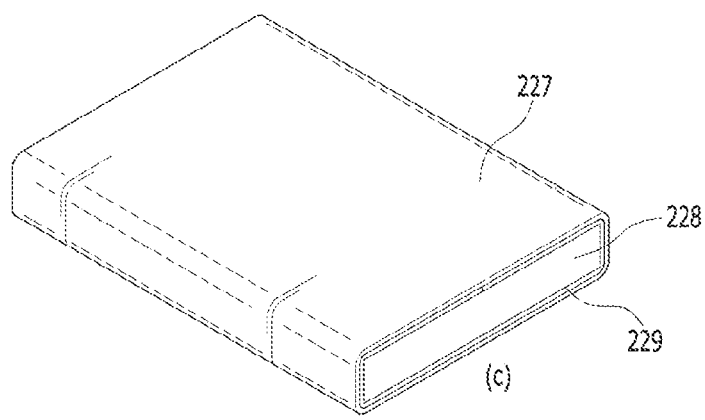

FIG. 8 is a sectional diagram illustrating a still further example of the drive-chip heat sink structure of the mobile terminal in accordance with the present disclosure. FIG. 9 is a diagram illustrating a method of fabricating the heat sink structure shown in FIG. 8. A thermal conductivity sheet 227 shown in FIG. 8 forms a continuous surface. Not the method surrounding one thermal conductivity sheet 227 mentioned above, a base sheet 229 shown in FIG. 9 (*a*) is wound around the flexible material and a surface of the flexible material with the base sheet 229 wound there around is plated, so that the thermal conductivity sheet 227 shown in FIG. 9 (*c*) can be formed.

The base sheet 229 is formed of a material of which a profile is changeable and a thin metallic layer 227 is plated on the surface. Like a wrapper of gum, one surface is formed of paper and the other surface of the base sheet 229 is formed of a metallic material. When a shock is applied to the frame 105, the profile of the base sheet 229 and the profile of the thermal conductivity sheet 227 can be changed according to the changed profile of the flexible material 228. Accordingly, the shock may be absorbed by the flexible material, while the thermal conductivity sheet 227 is not broken.

In the embodiments shown in FIGS. 7 and 8, no adhesive elements are provided in the thermal conductivity sheet. A conductive tape 226 is provided one or more of between the thermal conductivity sheet and the drive chip and between the thermal conductivity sheet and the frame.

As mentioned above, the heat generated in the drive chip of the mobile terminal may be effectively emitted. Only the portion of the mobile terminal, where the drive chip is loaded, may be prevented from being heated when the user is using the mobile terminal and the other components may be prevented from being damaged by the heat. In addition, the shock applied to the frame may not be transferred to the drive chip but be absorbed by the flexible material having a high compressibility.

When a particular feature, structure, or characteristic is described in connection with any embodiment, it is submitted that it is within the purview of one skilled in the art to affect such feature, structure, or characteristic in connection with other ones of the embodiments.

The invention claimed is:

1. A mobile terminal comprising:
   a display unit;
   a frame supporting a rear surface of the display unit, the frame comprising a metallic material;
   a case coupled to the frame;
   a mainboard disposed between the frame and the case;

a drive chip loaded in the mainboard;
a shield can covering components loaded in the mainboard, the shied comprising a hole formed, corresponding to the drive chip;
a thermal conductivity sheet comprising a first area and a second area; and
a flexible material insertedly filling in a space formed between the thermal conductivity sheet and the frame at the first area of the thermal conductivity sheet,
wherein one surface of the first area is adhered to the top surface of the drive chip, and the other surface of the first area is adhered to a lower surface of the flexible material, and one surface of the second area is in contact with the shield can and the other surface of the second area is in contact with the inner surface of the frame.

2. The mobile terminal of claim 1, wherein the thermal conductivity sheet is larger than the hole of the shield can, comprising an adhesive element.

3. The mobile terminal of claim 2, wherein the adhesion layer and the adhesive tape further comprise a thermal conductivity material.

4. The mobile terminal of claim 3, wherein the thermal conductivity sheet is TIM (Thermal Interface Material) or PCM (Phase Change Material).

5. The mobile terminal of claim 1, wherein the thermal conductivity sheet comprises,
a graphite fabric;
a PET sheet disposed on one surface of the graphite fabric; and
an adhesion layer disposed on the other surface of the graphite fabric.

6. The mobile terminal of claim 5, wherein further comprising:
an adhesive tape including a first portion and a second portion, the first portion disposed between the inner surface of the frame and the top surface of the flexible material and the second portion disposed between the inner surface of the frame and the adhesion layer at the second area of the thermal conductivity sheet.

7. The mobile terminal of claim 1, wherein the drive chip comprises an application processor AP which functions as a central processing unit CPU.

8. A mobile terminal comprising:
a display unit;
a frame supporting a rear surface of the display unit, the frame comprising a metallic material;
a case coupled to the frame;
a mainboard disposed between the frame and the case;
a drive chip loaded in the mainboard;
a shield can covering components loaded in the mainboard, the shied comprising a hole formed, corresponding to the drive chip;
a thermal conductivity sheet comprising a first thin sheet in contact with a top surface of the drive chip and a second sheet in contact with an inner surface of the frame; and
a flexible material insertedly filling in a space formed between the first thin sheet and the second thin sheet
wherein the first thin sheet disposed on one surface of the flexible material; and
wherein the second thin sheet disposed on the other surface of the flexible material, and
the portions of the first and second thin sheets which are projected around the flexible material are adhered to each other to form an adhered portion.

9. The mobile terminal of claim 8, wherein the adhered portion is formed by a thermal-compression-bonding method.

10. The mobile terminal of claim 8, further comprising:
a conductive tape provided one or more of between the thermal conductivity sheet and the drive chip and between the thermal conductivity sheet and the frame.

11. The mobile terminal of claim 10, wherein the conductive tape is TIM (Thermal Interface Material) or PCM (Phase Change Material).

12. A mobile terminal comprising:
a display unit;
a frame supporting a rear surface of the display unit, the frame comprising a metallic material;
a case coupled to the frame;
a mainboard disposed between the frame and the case;
a drive chip loaded in the mainboard;
a shield can covering components loaded in the mainboard, the shied comprising a hole formed, corresponding to the drive chip;
a flexible material insertedly filling in a space formed between the drive chip and the frame;
a base sheet wound around the flexible material; and
a thermal conductivity sheet plated on a surface of the base sheet and comprising a first area and the second area,
wherein the first area is adhered to a top surface of the drive chip, and the second area is in contact with the inner surface of the frame.

* * * * *